May 21, 1963
K. J. KNUDSEN
3,090,903
TRANSISTOR AMPLIFIER AND MOTOR LOAD
USING CONDUCTIVE CIRCUIT FEEDBACK
Original Filed May 3, 1957
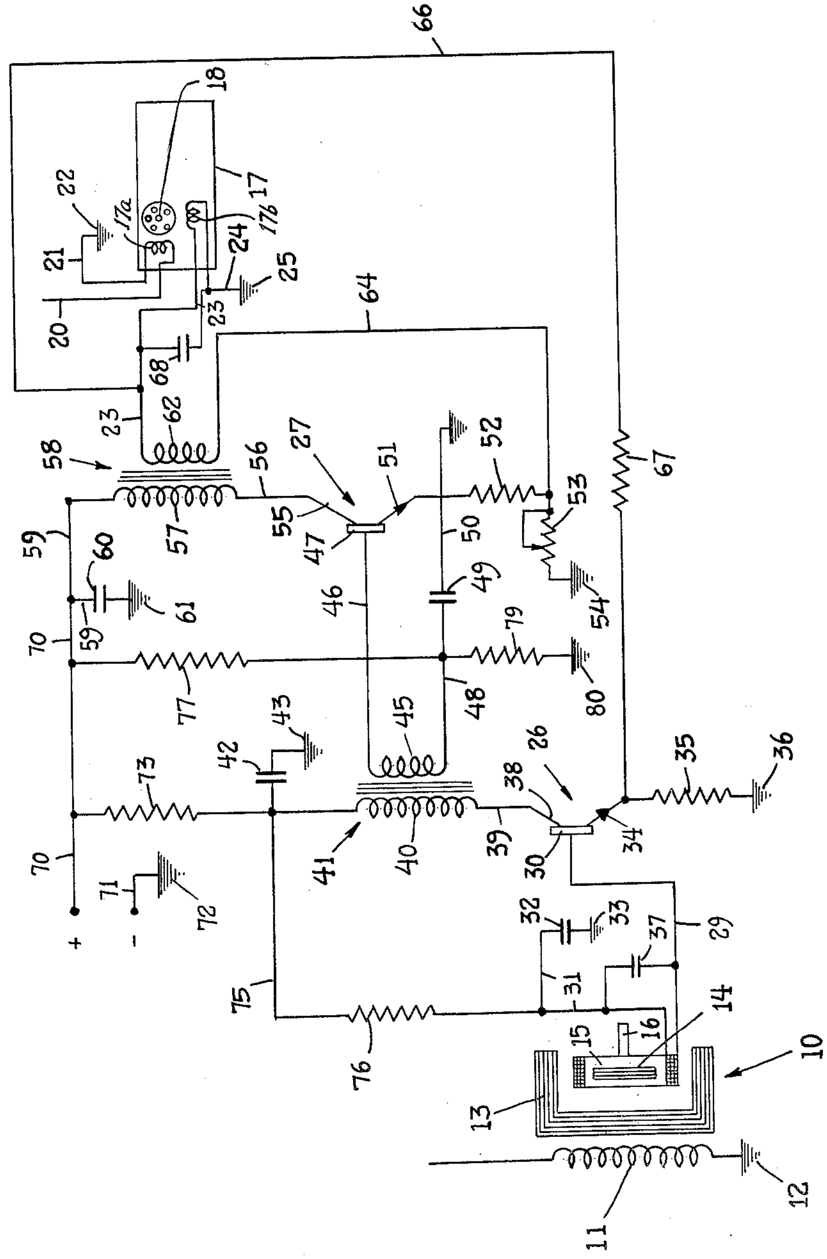
INVENTOR.
Knud J. Knudsen
BY
H. Gibner Lehmann United States Patent Office 3,090,903

Patented May 21, 1963

3,090,903

TRANSISTOR AMPLIFIER AND MOTOR LOAD USING CONDUCTIVE CIRCUIT FEEDBACK

Knud J. Knudsen, Middlebury, Conn., assignor to Lewis Engineering Company, Naugatuck, Conn.

Continuation of application Ser. No. 656,782, May 3, 1957. This application July 13, 1960, Ser. No. 43,701
8 Claims. (Cl. 318—448)

This invention relates to amplifier type controls employing transistors for effecting the amplification, and more particularly to a combined low-frequency, transistor-type amplifier and control system involving a motor load.

The present application is a continuation of my copending application Serial No. 656,782, filed May 3, 1957, and entitled Transistor Amplifier and Motor Load Using Conductive Circuit Feedback, which is now abandoned.

An object of the invention is to provide a novel and improved, feedback-type transistor amplifier and control circuit having a motor load associated therewith, which is extremely effective and reliable for low-frequency control applications, and which may be readily energized from a single, low-voltage source.

Another object of the invention is to provide an improved multi-stage transistor amplifier and control circuit as above set forth, wherein both positive and inverse feedback through an unbroken conductive path are provided in a manner to effect a reliable and efficient control responsive to relatively weak, low-frequency signals.

A further object of the invention is to provide an improved multi-stage transistor amplifier and control as above characterized, having collector and base bias voltages supplied from a single voltage source and having emitter degeneration in a common emitter circuit, with both positive and inverse feedback through an unbroken conductive path.

A feature of the invention resides in the provision of an improved multi-stage transistor amplifier and motor load wherein positive feedback through an unbroken conductive path is employed in the last or output stage in conjunction with inverse or negative feedback through an unbroken conductive path in a prior stage to provide stability of the amplifier and at the same time a high amplification factor at the relatively low frequencies handled.

Another feature of the invention resides in the provision of a novel load-current carrying motor load circuit with incorporated feedback means included with the transistor input circuit proper whereby the input circuit has the full load current.

Other features and advantages will hereinafter appear.

The single FIGURE of the drawings is a schematic circuit diagram of the present, improved multi-stage transistor amplifier and control system as provided by the invention.

As shown, the present transistor amplifier is intended to respond to a signal of relatively low frequency obtained from an A.-C. instrument movement 10 having an exciting coil 11 connected at one end to a ground 12 and at the other end to a source of supply, which may for example have a value of 13 volts at 400 cycles. The instrument movement 10 has a stationary laminated core structure 13, 14, providing a double air gap in which there is movably mounted a secondary or driven signal-supplying coil 15 adapted to be mechanically shifted in its rotative position by means of a suitable arm 16.

The control system further comprises a servo-motor unit 17 having an output shaft 18 suitable for actuating a potentiometer-type control or the like. The servo unit 17 may have a line or exciting coil 17*a* provided with leads 20 and 21 connected respectively to the 13 volt 400 cycle power supply (not shown) and to a ground 22. The unit 17 also has control leads 23 and 24, the latter being connected to a ground 25 and the lead 23 being intended to receive an amplified signal originating in the secondary coil 15 of the A.-C. instrument movement 10. The leads 23 and 24 are connected to a control winding 17*b*.

Amplification of the signal provided from the secondary coil 15 is effected by first and second stage amplifying transistors 26 and 27, connected in common emitter circuits, such transistors receiving collector and base bias voltages from a single D.-C. voltage source, there being emitter degeneration in conjunction with inverse feedback through an unbroken conductive path in the first stage transistor 26, and novel positive feedback through an unbroken conductive path in the second stage transistor 27.

The signal or input circuit of the transistor 26 comprises the movable coil 15 of the A.-C. instrument movement 10, such coil being connected by a wire 29 to the base 30 of the transistor 26, and being connected by a wire 31 to a coupling capacitor 32 which in turn is connected to a ground 33. The signal circuit further comprises the emitter 34 of the transistor 26, such emitter being connected with an emitter resistance 35 which is grounded at 36, thereby to provide emitter degeneration. The sensitivity of the input circuit as above set forth may be controlled by a capacitor 37 connected across the terminals of the movable coil 15 of the instrument movement 10. Varying the value of the capacitor 37 will provide a leading power factor of different magnitude thus increasing the sensitivity of this circuit as desired.

The output circuit of the transistor 26 includes the emitter 34 thereof and the emitter resistor 35, together with the ground 36. The output circuit also includes the transistor collector 38 connected by a wire 39 to the primary coil 40 of a coupling transformer 41, such coil being also connected to a blocking capacitor 42 in turn connected to a ground 43.

It will be understood that, by the provision of the emitter resistance 35 there is effected an appreciable increase in the input impedance of the first transistor amplifier stage.

The input circuit of the transistor 27 comprises the secondary coil 45 of the coupling transformer 41, such coil being connected by a wire 46 to the base 47 of the transistor 27, and being connected by a wire 48 to a coupling capacitor 49 which is in turn connected by a wire 50 to ground.

By this invention, in the output circuit of the transistor 27 there is a D.C. stabilization resistor 52 and a series-connected feedback resistor 53, the latter being joined to a ground 54. The resistor 53 is adapted to control positive feedback in the circuit of the transistor 27, as will be hereinafter more fully explained.

The output circuit of the transistor 27 further includes the collector 55 of the transistor, connected by a wire 56 to the primary coil 57 of a second coupling transformer 58, such primary coil being connected by a second wire 59 to a blocking capacitor 60 in turn connected to a ground 61. The output transformer 58 has a secondary coil 62 which is connected to the control line 23 of the servo unit 17.

In accordance with the present invention the secondary coil 62 of the output transformer 58 is further connected by a wire 64 to the junction of the resistors 52 and 53 in the emitter output circuit of the transistor 27. By virtue of this connection of the wire 64 I provide an advantageous positive feedback through an unbroken conductive path in the last or output amplifier stage having the transistor 27, and the value of the resistor 53 will control the amount of positive feedback which takes place.

I further provide for inverse feedback through an unbroken conductive path to the first amplifier stage having the transistor 26, and effect this by means of a wire 66 connected to the control lead 23 of the servo unit 17, such wire leading to a resistor 67 which is in turn connected to the emitter 34 of the transistor 26. The amount of inverse feedback may be varied by changing the value of the resistor 67, and with such organization in conjunction with the positive feedback controlled by the resistor 53 I am enabled to control readily and accurately the degree of amplification effected by the transistors 26 and 27 in the amplifier circuits, and to limit undesired or spurious signals or oscillations. By properly proportioning the resistors 53 and 67 in conjunction with the emitter degeneration resistor 35 an advantageous and effective control of the amplifier characteristics is obtainable.

Across the control winding **17*b* of the servo motor 17 I provide a tuning capacitor 68, to furnish a path for high frequency waves while enabling the 400 cycle amplified signal to pass along the wires 23 and 24 so as to energize the control circuit and coil 17*b* of the servo unit 17** which forms the inductor of the tuned circuit.

It will be noted that the resistors 52 and 53 are active in the input signal circuit proper of the transistor 27, such signal circuit comprising in addition the transformer coil 45, wires 46, 48 and ground 50 and the bypass capacitor 49. The resistor 52 carries the entire output current of the transistor 27, while the resistor 53 carries the entire control current of the servo unit 17 as well as the transistor output current, and the said currents are thus involved in the positive feedback action of the second transistor circuit, eliminating the degenerative effect of the D.-C. stabilzing resistor 52.

The wires 23 and 64 of the servo motor load circuit are seen to be of opposite instantaneous polarity, such wires not only carrying the servo load but also having the connections by which the positive and negative feedback actions through an unbroken conductive path are effected.

Energization of the output circuits of the transistors 26 and 27, as well as the base bias voltages are obtained from a single voltage source. As shown, the wire 59 of the output circuit of the transistor 27 is connected by means of a wire 70 to the plus terminal of a D.-C. supply (not shown) having a negative terminal connected by a wire 71 to a ground 72. The voltage of the D.-C. supply may, for example, be in the neighborhood of 28 volts. For energizing the load circuit of the transistor 26 I connect a resistor 73 to the primary coil 40 of the coupling transformer 41, and to the supply wire 70. For the purpose of providing a bias on the base 30 of the transistor 26, I connect a wire 75 to the resistor 73, such wire being also connected with a base bias resistance 76 which is in turn connected to the wire 31 of the input circuit of the transistor 26. This arrangement provides an automatic D.-C. stabilizer in the input since, if the D.-C. current though the collector reduces (decreases) the positive bias on the base will be decreased, thus reducing the collector current to its proper level. This is accomplished without signal degeneration due to the blocking condenser 42.

Also, to provide a bias voltage on the base 47 of the transistor 27, I connect a resistor 77 between the wires 70 and 48, and connect a resistor 79 between the wire 48 and a ground connection 80. By such connections, bias voltages for the bases 30 and 47 of the transistors 26 and 27 are obtained from the 28 volt D.-C. supply, and also potentials are obtained for the load circuits of the transistors. With the circuit as above set forth the following values of resistors may be advantageously employed: For the resistor 73: 7,800 ohms; for the resistor 76: 100,000 ohms; for the resistor 35: 2 ohms; for the resistor 79: 100 ohms; for the resistor 52: 22 ohms. The coupling capacitor 32 and bypass capacitor 49 may each be of 50 mfd. capacity. The impedance of the primary coil 40 of the coupling transformer 41 may be 2,000 ohms, and the impedance of the secondary coil 45 may be 50 ohms. The impedance of the primary coil 57 of the output transformer 58 may be 1,250 ohms, and the impedance of the secondary coil 62 may be 350 ohms. The value of the resistor 77 may be varied as needed to establish a proper bias on the base 47 of the transistor 27.

The negative feedback circuit to the transistor 26 involves the resistor 67, wire 66, wire 23, winding **17*b* in the servo motor control 17 which is connected with the wire 23, and finally the ground circuit 24, 25. A relatively high voltage exists between the ground 25 and the wire 23, on the order of 18 volts or so, and accordingly this voltage is utilized to effect the negative feedback to the first transistor 26 through the wire 66 and resistor 67. Normally, the resistor 67 has a fairly high value, this being determined by the amount of negative feedback which is desired. On the other hand, the resistor 35 has a relatively low value, given herein as 2 ohms. Accordingly, from the foregoing it is seen that the negative (voltage) feedback circuit is not especially concerned with the resistor 53 but instead may be more properly thought of as being controlled by the action of the servo motor control, which influences the voltage existing between the terminals of its control winding 17*b*, as between the ground 25 and the wire 23. When the motor 17 overshoots, the current in the control winding 17*b* becomes great, thereby reducing the voltage across the control winding (between the wires 23 and the ground 25). This results in much less negative feedback to the transistor 26. Accordingly, it is seen that the condition of the servo motor control 17 is a very important influence in connection with the negative feedback through the wire 66; also the servo motor control 17 is important in connection with the positive (current) feedback through the wire 64**.

By such conductive circuit positive (current) and negative (voltage) feedback, influenced mainly by the condition of the servo motor control 17, the present organization distinguishes from prior art devices wherein the final load is not utilized to effect the feedback required, nor is the final load connected by feedback means through an unbroken conductive path, as with the present device.

The use of such devices as a blocking condenser or isolating transformer interposed between the emitter 34 and resistor 67 would involve more costly components and would also effect an undesirable phase shift in the negative feedback circuit. With the present construction the provision of the simple resistor 67 results in a much less expensive construction, one that is simpler and involves smaller components having less weight, while at the same time there is not effected any phase shift in the feedback circuit with respect to the transformer secondary coil 62.

It is seen that the circuit from 34 to 36 comprises the low value resistor 35 of but 2 ohms resistance; the voltage between the emitter 34 and the ground 36 is on the order of a few millivolts, and the negative voltage feedback to such low impedance circuit is most readily effected by the simple resistor 67, responding to the voltage existing across the control coil of the motor unit 17 (as measured between the wires 23 and 24).

Considering saturation of the transformer 58, the wire 59 may, for example, carry .2 ampere, but since the transformer 58 is of the low impedance type, the saturation effect is relatively small, and the saturation factor of the core is less than the cost of adding to the circuit a capacitor and choke, which it is believed would be necessary to eliminate D.C. in the transformer 58. Accordingly, the slightly larger core for the transformer 58 is less undesirable than the addition of a choke and capacitor required to eliminate direct current in the transformer.

The importance and necessity of having the unbroken conductive circuit for the feedback control resides in the fact that fewer components may be utilized, and those components which are employed may be much less expensive; also the said components, in the form of resistors, do not cause a phase shift and are tiny as compared with capacitors of the type which would be required.

The action of the load 17 on the feedback is unique; also by this construction fewer components are required and the construction is simpler, less costly, and involves appreciably less weight. Further, problems of phase shift in the feedback circuits are not present.

Considering the action of the load 17, it is noted that for example, normally the motor 17 is being continually started, stalled, etc. in effecting the control. With such organization, the motor may overshoot a desired position. When such overshooting occurs, the motor is quickly and forcibly stopped by virtue of the high current which the motor draws in the control winding, said high current passing through the positive feedback 64 and to the resistors 52, 53 so as to directly affect the second transistor 27. At the same time, the heavy current in the servo motor control winding 17*b* reduces the voltage existing across the winding, and this reduces the negative feedback in the wire 66. The feedback is governed by the action of the motor, both as regards the negative and positive feedback circuits, and the conductive feedback circuit through the wire 64 enables this action above explained to be had.

By the above organization I have provided a simple and effective transistor-type amplifier and motor load control circuit adapted for amplification of signals of relatively low frequency, such amplifier employing both positive feedback through an unbroken conductive path to the second stage and inverse or negative feedback through an unbroken conductive path to a prior stage to control the amplification and limit undesired oscillations and spurious signals.

The amplifier shown provides a reliable control of the servo motor load unit 17 in response to variations in the signal induced in the movable instrument coil 15. The entire organization may be made up as a compact unit, requiring but small space; it is furthermore mechanically rugged and characterized by great reliability.

Variations and modifications may be made within the scope of the claims, and portions of the improvements may be used without others.

I claim:

1. A transistor amplifier having a transistor and a common-emitter circuit therefor, including an input circuit connected between the base and emitter of the transistor and including means providing an output circuit; an isolating type output transformer having primary and secondary coils and having its primary coil connected in said output circuit; a resistor connected to the emitter of the transistor, said resistor being in series in the said input and output circuits; means connected to an intermediate point on said series resistor and connected to the secondary coil of said output transformer, providing positive, current feedback without phase shift with respect to said secondary coil, through an unbroken conductive circuit from said secondary coil; an unbroken variable conductive motor load circuit connected with the transformer secondary coil, said load circuit including the transformer secondary coil and also including the said unbroken conductive feedback circuit, said feedback means being responsive to variations in the loading of the said load circuit.

2. The invention as defined in claim 1 in which the said resistor comprises two separate resistive elements at least one of which is variable, connected together in series at a common junction, and in which the unbroken conductive circuit of the means providing positive feedback is connected to the said junction.

3. The invention as defined in claim 1 in which there is a motor load which has one lead connected to the terminal of said resistor which is remote from the emitter, and in which the unbroken conductive circuit of the means providing positive feedback is connected to a point on the said resistor which is removed from the said load connection.

4. A multi-stage transistor amplifier adapted to energize a variable load, said amplifier having a first transistor and a common-emitter circuit therefor; a final transistor and a common-emitter circuit therefor, including an input circuit; means coupling said circuits together; means providing an output circuit connected to the final transistor; an isolating type output transformer having primary and secondary coils and having its primary coil connected in said output circuit; an unbroken, conductive, variable motor load connected to said secondary coil; an emitter degeneration resistor connected to the emitter of said first transistor; means connected to the degeneration resistor, providing negative feedback through an unbroken conductive circuit from the secondary coil of the output transformer without phase shift with respect to said secondary coil; a second resistor, connected to the emitter of the second transistor, said second resistor being in series in the said input and output circuits of the second transistor; and means connected to said second resistor and connected to the secondary coil of said output transformer, providing positive feedback without phase shift with respect to said secondary coil, through an unbroken conductive circuit from the secondary coil, said coil being adapted for connection to the variable load and said feedback means being thereby responsive to variations of the load to which the said output transformer secondary coil is connected.

5. The invention as defined in claim 4 in which the unbroken circuit of the means providing positive feedback is connected to a point on said second resistor located intermediate the ends thereof.

6. The invention as defined in claim 5 in which the said second resistor is series connected in the said output circuit and carries the entire current thereof, a portion of said resistor also carrying the entire load current of the transformer secondary coil.

7. The invention as defined in claim 4 in which the final transistor next follows the first transistor, and in which the said means providing feedback are connected to points of opposite instantaneous polarity of the transformer secondary coil.

8. A multi-stage transistor amplifier having a first transistor and a common-emitter circuit therefor, including an input circuit; means coupling said circuits together; means providing an output circuit connected to the final transistor; an isolating type output transformer having primary and secondary coils and having its primary coil connected in said output circuit; an emitter degeneration resistor connected to the emitter of said first transistor; means connected to the degeneration resistor, providing negative feedback through an unbroken conductive circuit from the secondary coil of the output transformer without phase shift with respect to said secondary coil; a second resistor, connected to the emitter of the second transistor, said second resistor being in series in the said input and output circuits of the second transistor; means connected to said second resistor and connected to the secondary coil of said output transformer, providing positive feedback without phase shift with respect to said secondary coil, through an unbroken conductive circuit from said secondary coil; and an unbroken variable conductive motor load circuit connected with the transformer secondary coil, said load circuit including the transformer secondary coil and including said unbroken conductive feedback circuit, said feedback means being responsive to variations in the loading of the said load circuit.

References Cited in the file of this patent

UNITED STATES PATENTS 2,692,358 Wild ------------------ Oct. 19, 1954

FOREIGN PATENTS 164,807 Australia -------------- Aug. 24, 1955

OTHER REFERENCES

"Electronics" Magazine, Feb. 1, 1957, page 169.